US00RE49355E

(19) United States
(12) Reissued Patent
Suh et al.

(10) Patent Number: US RE49,355 E
(45) Date of Reissued Patent: Jan. 3, 2023

(54) EVENT-BASED VISION SENSOR AND DIFFERENCE AMPLIFIER WITH REDUCED NOISE AND REMOVED OFFSET

(71) Applicant: SAMSUNG ELECTRONICS CO., LTD., Suwon-si (KR)

(72) Inventors: Yunjae Suh, Suwon-si (KR); Sung Ho Kim, Yongin-si (KR); Junseok Kim, Hwaseong-si (KR); Eric Hyunsurk Ryu, Hwaseong-si (KR)

(73) Assignee: SAMSUNG ELECTRONICS CO., LTD., Suwon-si (KR)

(21) Appl. No.: 16/533,895

(22) Filed: Aug. 7, 2019

Related U.S. Patent Documents

Reissue of:
(64) Patent No.: 9,739,660
Issued: Aug. 22, 2017
Appl. No.: 14/802,401
Filed: Jul. 17, 2015

(30) Foreign Application Priority Data

Mar. 9, 2015 (KR) ..... 10-2015-0032619

(51) Int. Cl.
*G01J 1/44* (2006.01)
*H03F 1/30* (2006.01)
*H03F 3/08* (2006.01)
*G01J 1/46* (2006.01)

(52) U.S. Cl.
CPC . *G01J 1/44* (2013.01); *G01J 1/46* (2013.01); *H03F 1/303* (2013.01); *H03F 3/082* (2013.01); *G01J 2001/446* (2013.01); *H03F 2200/129* (2013.01); *H03F 2200/375* (2013.01); *H03F 2200/555* (2013.01)

(58) Field of Classification Search
CPC ..... G01J 1/44; G01J 2001/446; H03F 1/303; H03F 3/082; H03F 2200/129; H03F 2200/375
See application file for complete search history.

(56) References Cited

U.S. PATENT DOCUMENTS 6,642,503 B2 * 11/2003 Kummaraguntla ..... G01J 1/44 250/214 P
6,660,989 B2 * 12/2003 Guo ..... H04N 3/155 250/208.1
6,797,934 B2 9/2004 Kramer et al.
7,075,130 B2 7/2006 Delbruck et al.
7,105,793 B2 * 9/2006 Rhodes ..... H01L 27/14627 250/208.1

(Continued)

FOREIGN PATENT DOCUMENTS

KR 10-2004-0093901 A 11/2004
KR 10-2005-0038026 A 4/2005
KR 10-2014-0103116 A 8/2014

*Primary Examiner* — Woo H Choi
(74) *Attorney, Agent, or Firm* — Sughrue Mion, PLLC

(57) ABSTRACT

A circuit configured to amplify a signal from which an offset is cancelled includes an amplifier including an input stage configured to receive an input signal, the amplifier configured to amplify the input signal and output the amplified signal, and a switch including a transistor configured to reset the amplifier in response to a reset signal, the transistor including a body node connecting the transistor to the circuit, the transistor being configured to form a current path between the body node of the transistor and the input stage of the amplifier.

17 Claims, 20 Drawing Sheets

(56) References Cited

U.S. PATENT DOCUMENTS

| | | | | |
|---|---|---|---|---|
| 7,388,183 | B2 | 6/2008 | Takayanagi et al. | |
| 7,518,645 | B2 * | 4/2009 | Farrier | H01L 27/14603 250/208.1 |
| 7,532,244 | B2 | 5/2009 | Ishikawa et al. | |
| 7,652,754 | B2 | 1/2010 | Barrows | |
| 7,728,269 | B2 | 6/2010 | Lichtsteiner et al. | |
| 8,426,793 | B1 | 4/2013 | Barrows | |
| 8,570,393 | B2 | 10/2013 | Moed et al. | |
| 8,780,240 | B2 | 7/2014 | Posch et al. | |
| 2013/0206960 | A1 * | 8/2013 | Huang | H01L 27/146 250/206 |
| 2014/0125994 | A1 | 5/2014 | Kim et al. | |
| 2014/0204250 | A1 | 7/2014 | Kim et al. | |
| 2014/0231623 | A1 | 8/2014 | Serrano Gotarredona et al. | |
| 2016/0071849 | A1 * | 3/2016 | Singhal | H03K 19/0027 257/371 |

* cited by examiner

EVENT-BASED VISION SENSOR AND DIFFERENCE AMPLIFIER WITH REDUCED NOISE AND REMOVED OFFSET

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATION

[This application claims priority from Korean Patent Application No. 10-2015-0032619, filed on Mar. 9, 2015, in the Korean Intellectual Property Office, the disclosure of which is incorporated herein by reference in its entirety.] *This is a reissue application of U.S. Pat. No. 9,739,660, which was filed as U.S. patent application Ser. No. 14/802,401 on Jul. 17, 2015 and issued on Aug. 22, 2017, and which claims priority from Korean Patent Application No. 10-2015-0032619, filed on Mar. 9, 2015 in the Korean Intellectual Property Office, the disclosures of which are incorporated herein by reference in their entireties.*

BACKGROUND

1. Field

Methods and apparatuses consistent with exemplary embodiments relate to removing an offset and reducing noise in a difference amplifier and an event-based vision sensor.

2. Description of the Related Art

A sensor with a plurality of pixels may include a detector configured to detect a signal for each of the pixels, an analog circuit configured to amplify the detected signal, and a digital circuit configured to process the amplified signal.

However, due to an error caused by an offset and device noise in the analog circuit, an error signal may be detected for each of the pixels. Accordingly, power may be unnecessarily consumed in each of the pixels, and a signal processing efficiency in the digital circuit may be reduced.

When an existing circuit design scheme is used to cancel an offset and to reduce device noise, a size of a circuit may increase and power consumption may increase in each pixel of the circuit due to an added circuit.

SUMMARY

Exemplary embodiments may address at least the above problems and/or disadvantages and other disadvantages not described above. Also, the exemplary embodiments are not required to overcome the disadvantages described above, and an exemplary embodiment may not overcome any of the problems described above.

According to an aspect of an exemplary embodiment, there is provided a circuit configured to amplify a signal from which an offset is cancelled, the circuit including an amplifier including an input stage configured to receive an input signal, the amplifier configured to amplify the input signal and output the amplified signal, and a switch including a transistor configured to reset the amplifier in response to a reset signal, the transistor including a body node connecting the transistor to the circuit, wherein the transistor is configured to form a current path between the body node of the transistor and the input stage of the amplifier.

According to another aspect of an exemplary embodiment, there is provided a circuit configured to amplify a signal from which noise is reduced, the circuit including an amplifier configured to amplify an input signal, the amplifier including an input stage configured to receive the input signal and an output stage configured to output the amplified signal, a switch including a transistor configured to reset the amplifier in response to a reset signal, and a first diode configured to form a current path between the input stage and the output stage of the amplifier so that a leakage current generated by the amplifier flows through the current path.

According to another aspect of an exemplary embodiment, there is provided an event-based vision sensor including a sensing element configured to sense an event, the sensing element including an event detector configured to detect an occurrence of the event and generate an input signal based on the detected occurrence, a difference amplifier configured to amplify the input signal, and an event signal generator configured to generate an event signal corresponding to the amplified signal by processing the amplified signal, wherein the difference amplifier includes an input terminal configured to receive the input signal and an output terminal configured to output the amplified signal, and a switch configured to reset the difference amplifier in response to a reset signal, the switch including a node connecting the switch to the sensing element, and wherein the switch is configured to form a current path between the input terminal and the output terminal of the difference amplifier by a connection between the output terminal and the node.

BRIEF DESCRIPTION OF THE DRAWINGS

The above and other aspects of exemplary embodiments will become apparent and more readily appreciated from the following detailed description of certain exemplary embodiments, taken in conjunction with the accompanying drawings of which.

DETAILED DESCRIPTION

Figure 1:
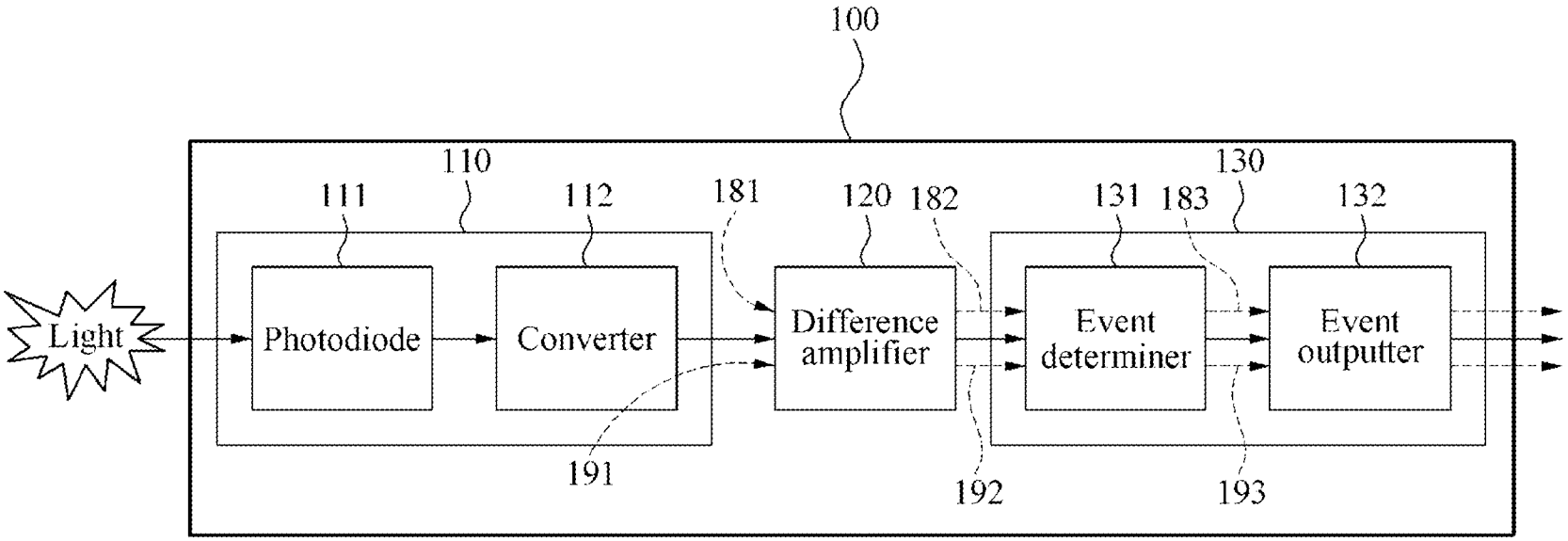
FIG. 1 is a block diagram illustrating a configuration of a sensing element included in an event-based vision sensor according to an exemplary embodiment.

Reference will now be made in detail to exemplary embodiments, examples of which are illustrated in the accompanying drawings, wherein like reference numerals refer to the like elements throughout. Exemplary embodiments are described below in order to explain certain exemplary embodiments by referring to the figures.

FIG. 1 is a block diagram illustrating a configuration of a sensing element included in an event-based vision sensor according to an exemplary embodiment.

The event-based vision sensor may include at least one sensing element, for example, a sensing element 100. For example, the event-based vision sensor may include 128× 128 sensing elements 100.

The sensing element 100 may detect an occurrence of a predetermined event, and may output an event signal.

According to an exemplary embodiment, an event may include, for example, an event in which an intensity of light changes. For example, an event may be sensed and output using a vision sensor based on an event in which an external object is captured.

The event-based vision sensor may asynchronously output an event signal by detecting a change in an intensity of incident light. For example, when an event in which an intensity of light increases is detected by a sensing element 100 in the event-based vision sensor, the sensing element 100 may output an ON event. When an event in which an intensity of light decreases is detected by the sensing element 100, the sensing element 100 may output an OFF event.

Unlike a frame-based vision sensor, the event-based vision sensor may output an event signal in only a sensing element corresponding to a portion in which an intensity of light changes, instead of scanning an output of a photodiode of each sensing element for each frame. An intensity of light incident on the event-based vision sensor may change based on a movement of an external object or a movement of the event-based vision sensor.

For example, when a light source is substantially fixed over time, and when an external object does not self-emit light, light emitted from the light source and reflected by the external object may be incident on the event-based vision sensor. When the external object, the light source and the event-based vision sensor do not move, light reflected by the stationary external object is substantially unchanged and accordingly, an intensity of light incident on the event-based vision sensor may be unchanged. In contrast, when the external object moves, light reflected by the moving external object is changed based on a movement of the external object, and accordingly, the intensity of the light incident on the event-based vision sensor may be changed.

An event signal output in response to a movement of an external object may be asynchronously generated information, and may be similar to an optic nerve signal transferred from a retina to a brain. For example, the event signal may be generated when a moving object, instead of a stationary object, is detected.

The above-described event-based vision sensor may utilize only time information and/or an address of a sensing element in which an intensity of light changes, and accordingly, an amount of information to be processed may be greatly reduced, in comparison to processing operations performed by a typical image camera.

Referring to FIG. 1, the sensing element 100 may include an event detector 110, a difference amplifier 120, and an event signal generator 130.

The event detector 110 may detect an occurrence of an event and may generate an input signal. The event detector 110 may include a photodiode 111 and a converter 112.

The photodiode 111 may output a current corresponding to a change in an intensity of received light, in response to reception of the light. The converter 112 may convert the current output from the photodiode 111 to an input signal in a form of a voltage. The input signal may be transferred to the difference amplifier 120.

The difference amplifier 120 may amplify the input signal received from the event detector 110. Examples of a configuration of the difference amplifier 120 will be described in detail below with reference to FIGS. 2 through 4 and 6A through 8A.

The event signal generator 130 may process the amplified signal and may generate an event signal corresponding to the amplified signal. The event signal generator 130 may include an event determiner 131 and an event outputter 132.

The event determiner 131 may determine whether an event occurs and a type of event occurring among different types of events, based on the amplified signal, and may generate an event signal corresponding to the event. For example, the event determiner 131 may determine whether an event occurs based on a result obtained by comparing the amplified signal and a predetermined threshold. In response to the event occurring, the event determiner 131 may determine a type of the event (for example, an ON event or an OFF event), and may generate an event signal corresponding to the event. For example, the event determiner 131 may generate an event signal with a value of "1" corresponding to the ON event, and an event signal with a value of "−1" corresponding to the OFF event.

The event outputter 132 may output an event signal generated by the event determiner 131 and coordinates of a pixel in which a corresponding event occurs to the outside of a pixel array. For example, the event outputter 132 may output coordinates of a pixel in which an event occurs, using an address event representation (AER) protocol. The AER protocol may be an asynchronous handshaking protocol used to transmit an event signal.

For example, when the sensing element 100 is in a standby state (for example, a state in which an event does not occur) during an arbitrary period of time (for example, a long period of time such as about 1 second), a direct current (DC) offset 181 may occur in the difference amplifier 120. When the DC offset 181 is not cancelled, the difference amplifier 120 may output an amplified DC offset 182. The event determiner 131 may determine that a systematic false event 183 occurs due to the amplified DC offset 182.

In addition, device noise 191 may occur in the converter 112. The device noise 191 may occur due to an electric interaction between sensing elements 100 or devices in the event-based vision sensor and/or an internal structure of each of the devices. When the device noise 191 is not reduced in the difference amplifier 120, the difference amplifier 120 may output amplified device noise 192. The event determiner 131 may determine that a random false event 193 occurs due to the amplified device noise 192. The random false event 193 may randomly occur.

According to an exemplary embodiment, the systematic false event 183 and the random false event 193 may be referred to as "error events."

According to an exemplary embodiment, the systematic false event 183 occurring in the sensing element 100 of the event-based vision sensor may be removed and an occurrence of the random false event 193 may be inhibited. Thus, it is possible to reduce power consumption due to an error event, and to increase a processing efficiency of a back-end application processor (AP).

Figure 2:
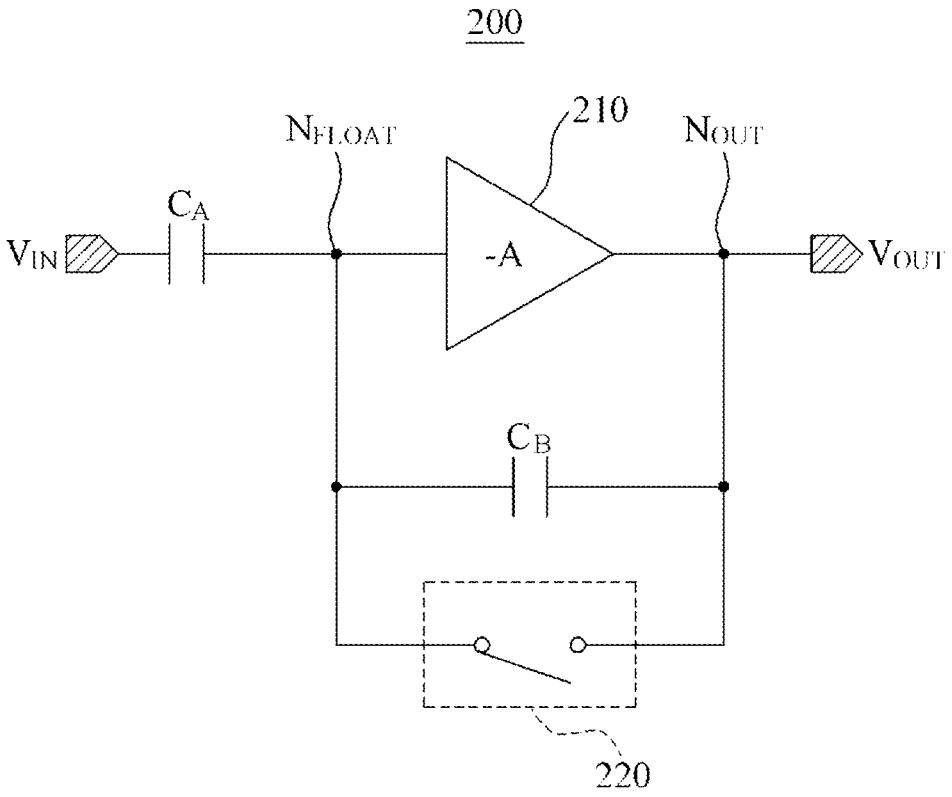
FIG. 2 is a diagram illustrating a configuration of a difference amplifier according to an exemplary embodiment.

FIG. 2 illustrates a configuration of a difference amplifier 200 according to an exemplary embodiment.

According to an exemplary embodiment, it will be understood that when an element is referred to as being "connected" or "coupled" to another element, the element can be directly connected or coupled to the other element or intervening elements may be present. Expressions used to explain a relationship between components, for example, "between" or "neighboring," should be interpreted in a like fashion.

Referring to FIG. 2, the difference amplifier 200 may include an amplifier 210 and a switch 220. Also, the difference amplifier 200 may include a first capacitor $C_A$ and a second capacitor $C_B$.

The amplifier 210 may amplify an input signal. The input signal may be received via an input terminal $V_{IN}$ of the difference amplifier 200. For example, the amplifier 210 may have a negative gain (for example, −A). The amplifier 210 may be connected to the input terminal $V_{IN}$ and an output terminal $V_{OUT}$ of the difference amplifier 200. The amplifier 210 may be connected to the input terminal $V_{IN}$ via the first capacitor $C_A$.

The switch 220 may reset the amplifier 210 in response to a reset signal. For example, the switch 220 may include a transistor configured to reset the amplifier 210 in response to the reset signal. In this example, the switch 220 may allow both ends of the switch 220 to be shorted, and may initialize the amplifier 210 so that voltages applied to an input stage and an output stage of the amplifier 210 may be equal to each other. As shown in FIG. 2, one side of the switch 220 may be connected to the input stage of the amplifier 210, and another side of the switch 220 may be connected to the output stage of the amplifier 210.

The first capacitor $C_A$ may be connected to the input terminal $V_{IN}$ and the input stage of the amplifier 210. The second capacitor $C_B$ may be connected to the input stage and the output stage of the amplifier 210.

One side of the first capacitor $C_A$, the input stage of the amplifier 210, one side of the second capacitor $C_B$, and one side of the switch 220 may be connected via a floating node $N_{FLOAT}$. Additionally, the output stage of the amplifier 210, the output terminal $V_{OUT}$, another side of the second capacitor $C_B$, and another side of the switch 220 may be connected via an output node $N_{OUT}$.

Figure 3A:
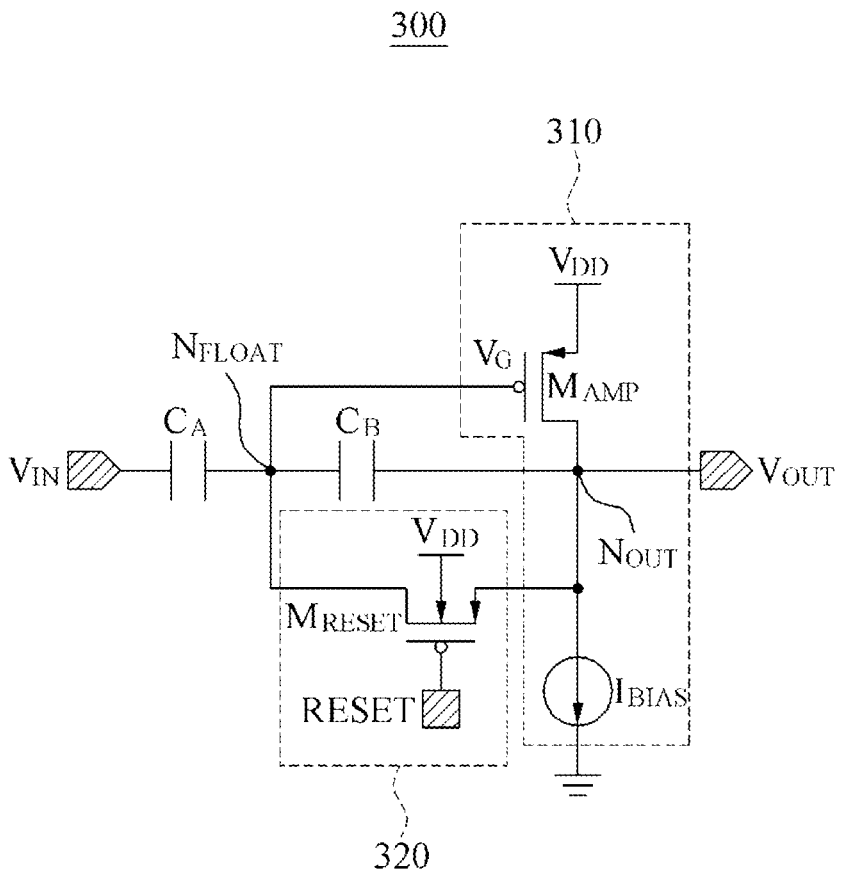
FIG. 3A is a diagram illustrating an example of a configuration of a difference amplifier according to an exemplary embodiment.

FIG. 3A is a diagram illustrating an example of a configuration of a difference amplifier 300 according to an exemplary embodiment.

FIG. 3A illustrates an example of a circuit of the difference amplifier 200 of FIG. 2. The amplifier 210 and the switch 220 of FIG. 2 may respectively correspond to an amplifier 310 and a switch 320 of FIG. 3A. However, the amplifier 210 and the switch 220 are not limited to being implemented as the amplifier 310 and the switch 320, and this configuration is provided by way of an example only. The amplifier 210 may include, for example, an amplifier 311 of FIG. 3B or an amplifier 312 of FIG. 3C, and the switch 220 may include, for example, a switch 321 of FIG. 3D and a switch 322 of FIG. 3E.

The amplifier 310 may include a transistor $M_{AMP}$ configured to amplify an input signal. In the transistor $M_{AMP}$, a source node may be connected to a supply voltage $V_{DD}$, a gate node may be connected to an input terminal $V_{IN}$ of the difference amplifier 300, and a drain node may be connected to an output terminal $V_{OUT}$ of the difference amplifier 300. The gate node and the drain node of the transistor $M_{AMP}$ may correspond to an input stage of and an output stage of the amplifier 310, respectively. In other words, the transistor $M_{AMP}$ of the amplifier 310 may be, for example, a P-channel metal-oxide-semiconductor (PMOS) transistor including a source node connected to a supply voltage, a gate node configured to receive the input signal, and a drain node configured to output an output signal corresponding to the amplified signal.

In addition, the amplifier 310 may include a power source configured to supply a bias power to the transistor $M_{AMP}$ and a transistor $M_{RESET}$ included in the switch 320. The power source may be, for example, a current source $I_{BIAS}$ configured to supply a bias power.

The switch 320 may include the transistor $M_{RESET}$ configured to reset the amplifier 310 in response to a reset signal. In the transistor $M_{RESET}$, a source node may be connected to the output stage of the amplifier 310, a gate node may receive a reset signal RESET, a drain node may be connected to the input stage of the amplifier 310, and a body node may be connected to the supply voltage $V_{DD}$. For example, the switch 320 may allow a voltage $V_G$ of a gate node of the amplifier 310 to be equal to a voltage of the output stage of the amplifier 310, and may reset the amplifier 310.

The transistors $M_{AMP}$ and $M_{RESET}$ of FIG. 3A may be, for example, PMOS transistors, but are not limited thereto, and PMOS transistors are provided by way of an example only. For example, N-channel MOS (NMOS) transistors may be used as the transistors $M_{AMP}$ and $M_{RESET}$. In another example, a PMOS transistor may be used as the transistor $M_{AMP}$ and an NMOS transistor may be used as the transistor $M_{RESET}$. In another example, an NMOS transistor may be used as the transistor $M_{AMP}$ and a PMOS transistor may be used as the transistor $M_{RESET}$. In the following description, a PMOS transistor will be exemplarily described, however, the exemplary embodiments are not limited to this example. As described above, transistors may be used in various combinations based on a design.

A configuration of the amplifier 210 is not limited to being the amplifier 310 of FIG. 3A, and may include, for example, all configurations enabling amplification of a signal. For example, the amplifier 210 may include a single transistor, or have various structures and configurations with a combination of a plurality of transistors. Examples of the amplifier 210 will be described below with reference to FIGS. 3B and 3C.

Figure 3D:
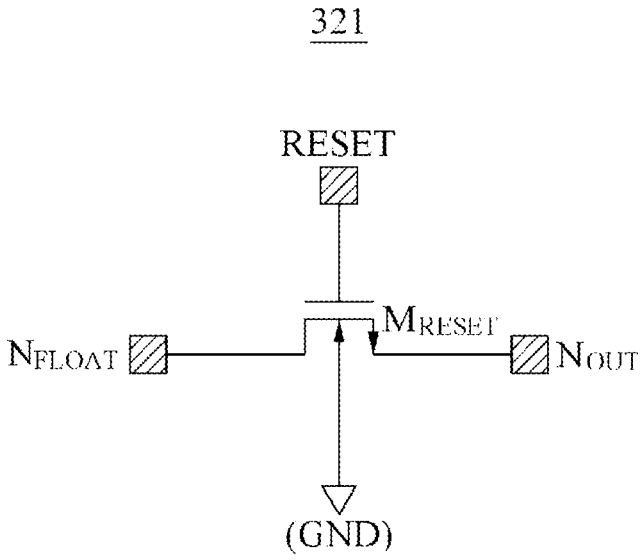
FIGS. 3D and 3E are diagrams illustrating examples of a switch according to an exemplary embodiment.
Figure 3E:
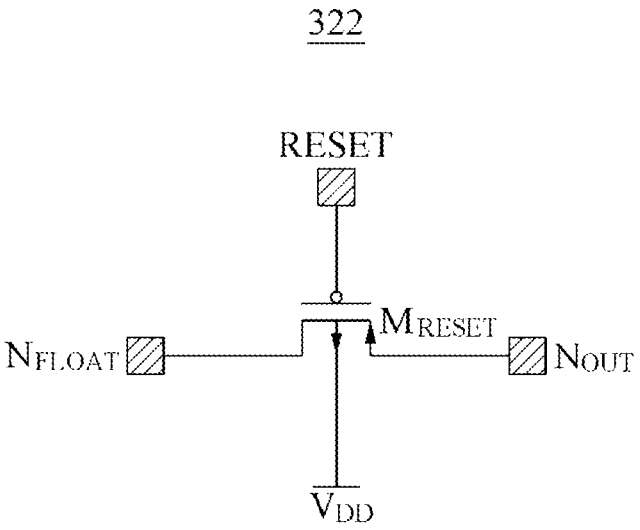
Figure 4:
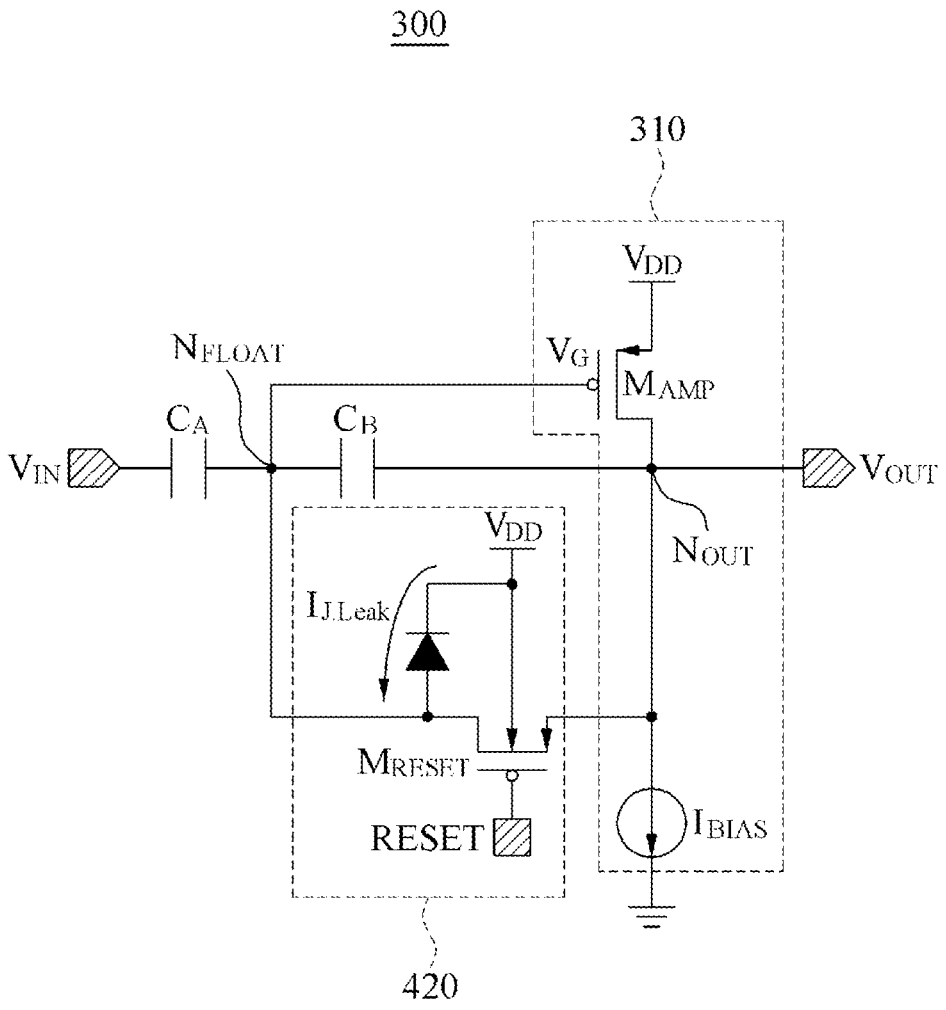
FIG. 4 is a diagram illustrating another example of a configuration of a difference amplifier according to an exemplary embodiment.

An equivalent circuit of the switch 320 may be represented as, for example, a switch 420 of FIG. 4. However, a configuration of the switch 220 of FIG. 2 is not limited to the switch 320 of FIG. 3A, and may include, for example, various configurations. Examples of the switch 220 will be described below with reference to FIGS. 3D and 3E.

Figure 3B:
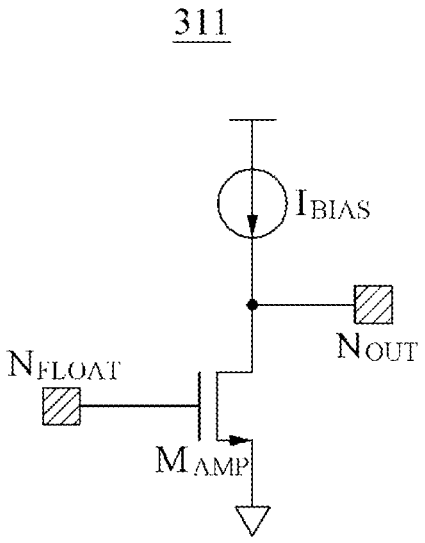
FIGS. 3B and 3C are diagrams illustrating examples of an amplifier according to an exemplary embodiment.
Figure 3C:
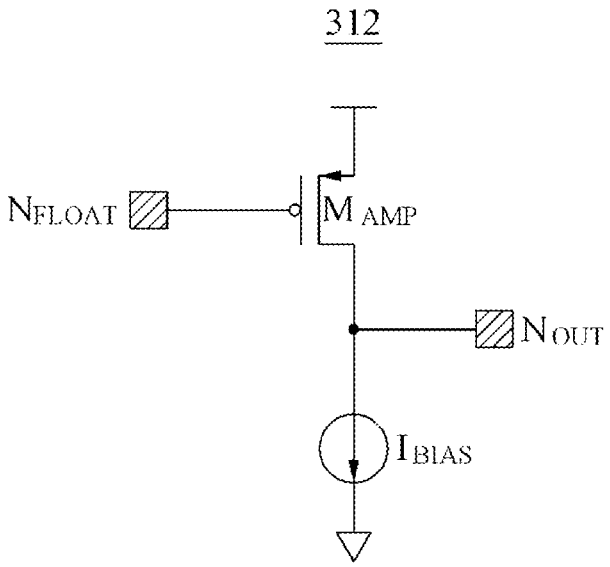

FIGS. 3B and 3C illustrate examples of a configuration of an amplifier according to an exemplary embodiment.

The amplifier 311 of FIG. 3B and the amplifier 312 of FIG. 3C may be examples of the amplifier 210 of FIG. 2.

Referring to FIG. 3B, the amplifier 311 may include a bias current source $I_{BIAS}$ and a transistor $M_{AMP}$ configured to amplify an input signal. The transistor $M_{AMP}$ of the amplifier 311 may be, for example, an NMOS transistor including a gate node connected to a floating node $N_{FLOAT}$ and a drain node connected to the bias current source $I_{BIAS}$ and an output node $N_{OUT}$.

A transistor $M_{AMP}$ of the amplifier 312 may be, for example, a PMOS transistor including a gate node connected to a floating node $N_{FLOAT}$ and a drain node connected to the bias current source $I_{BIAS}$ and an output node $N_{OUT}$.

FIGS. 3D and 3E illustrate examples of a configuration of a switch according to an exemplary embodiment.

The switch 321 of FIG. 3D and the switch 322 of FIG. 3E are examples of the switch 220 of FIG. 2.

Referring to FIG. 3D, the switch 321 may include a transistor $M_{RESET}$ configured to reset the amplifier 210 in response to a reset signal RESET. The transistor $M_{RESET}$ of the switch 321 may be, for example, an NMOS transistor including a drain node connected to a floating node $N_{FLOAT}$, a gate node configured to receive the reset signal RESET, a source node connected to an output node $N_{OUT}$, and a body node connected to the ground GND.

A transistor $M_{RESET}$ of the switch 322 may be, for example, a PMOS transistor including a drain node connected to a floating node $N_{FLOAT}$, a gate node configured to receive a reset signal RESET, a source node connected to an output node $N_{OUT}$, and a body node connected to a supply voltage $V_{DD}$.

FIG. 4 is a diagram illustrating another example of a configuration of the difference amplifier 300 according to an exemplary embodiment.

The switch 420 of FIG. 4 may be, for example, a diode having a PN junction formed between a body node and a drain node due to a supply voltage $V_{DD}$ applied to the body node. For example, due to the diode, a junction leakage current $I_{J.Leak}$ may be generated from the supply voltage $V_{DD}$ and may flow toward a floating node $N_{FLOAT}$. A voltage drop may occur in the diode due to the junction leakage current $I_{J.Leak}$, which may cause a DC offset to occur in an amplifier 310.

For example, in a source junction and a drain junction of a metal-oxide semiconductor field-effect-transistor (MOSFET), the junction leakage current $I_{J.Leak}$ flowing to the body node may be generated. When the junction leakage current $I_{J.Leak}$ is applied to a gate node of a transistor $M_{AMP}$ in the amplifier 310, a DC offset voltage may be generated (for example, in a PMOS transistor, a gate voltage $V_G$ increases and an output voltage $V_{OUT}$ decreases), which may cause a systematic false event to continuously occur.

When the device noise occurring in the converter 112 of FIG. 1 is applied to difference amplifier 300 and is amplified, a random false event may occur.

Figure 5:
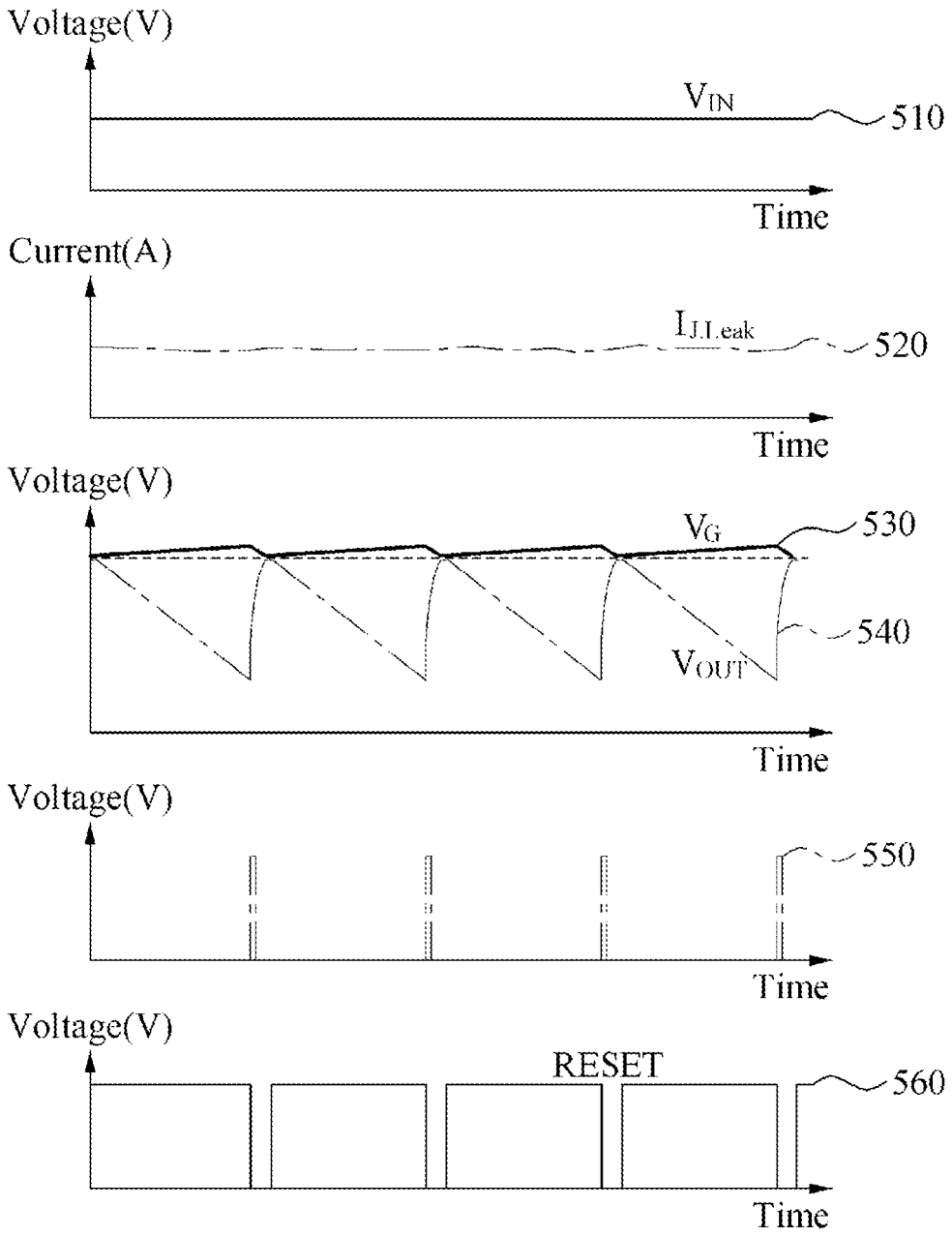
FIG. 5 illustrates a process of outputting an event signal in an event-based vision sensor including the difference amplifier of FIGS. 3A and 4.

FIG. 5 illustrates a process of outputting an event signal in an event-based vision sensor including the difference amplifier 300 of FIGS. 3A and 4.

In FIG. 5, an input voltage $V_{IN}$ 510 as an input signal may be assumed to be in a standby state at a predetermined voltage level. In the difference amplifier 300, a junction leakage current $I_{J.Leak}$ 520 may be generated and accordingly, a DC offset voltage may be generated as described above.

Due to a voltage drop in a diode caused by the junction leakage current $I_{J.Leak}$ 520, a gate voltage $V_G$ 530 may increase. Accordingly, a value of an output voltage $V_{OUT}$ 540 may also increase. For example, when an amplifier has a negative gain, the output voltage $V_{OUT}$ 540 may increase in a negative direction.

When the gate voltage $V_G$ 530 and the output voltage $V_{OUT}$ 540 change even though the input voltage $V_{IN}$ 510 remains unchanged, an event signal generator may generate an event signal 550 corresponding to an error event. The amplifier may be initialized by a reset signal RESET 560. However, when a waiting time continues, a DC offset may occur. Thus, the event signal 550 may be periodically generated.

FIGS. 6A, 6B, 7A, 7B, 8A and 8B illustrate examples of a configuration of a difference amplifier 600 for cancelling a DC offset according to exemplary embodiments.

Figure 6A:
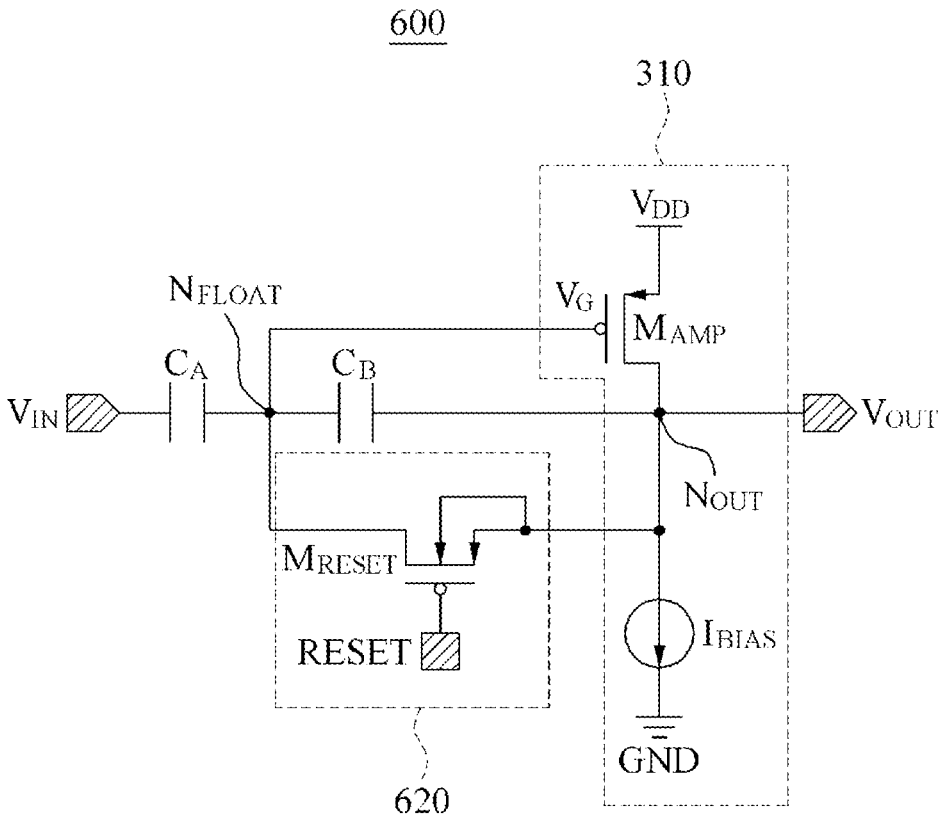
FIGS. 6A, 6B, 7A, 7B, 8A and 8B are diagrams illustrating examples of a configuration of a difference amplifier for cancelling a direct current (DC) offset according to an exemplary embodiment.
Figure 6B:
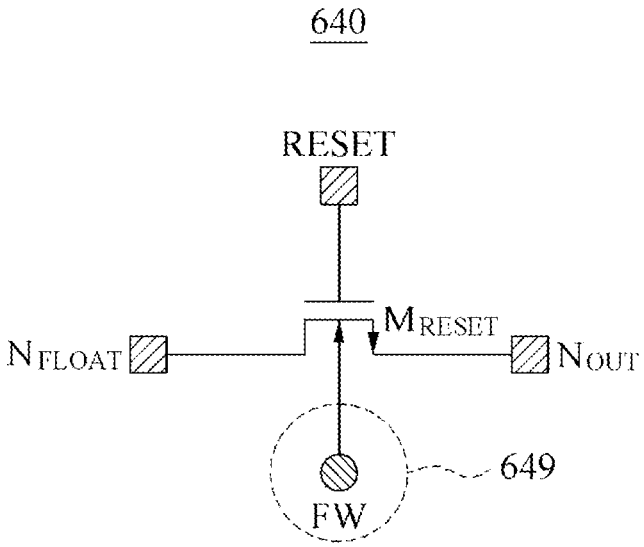
Figure 7A:
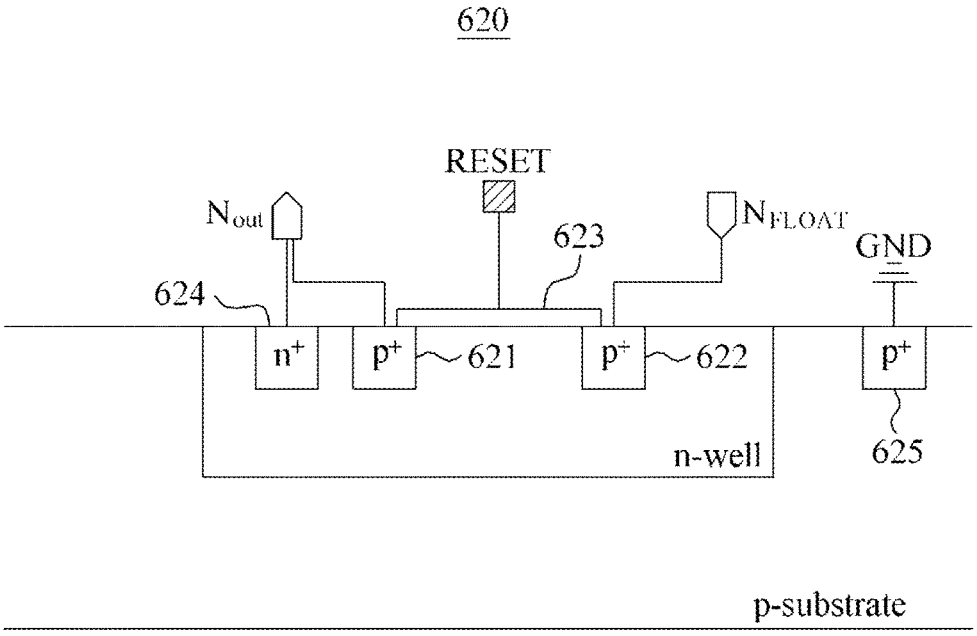
Figure 7B:
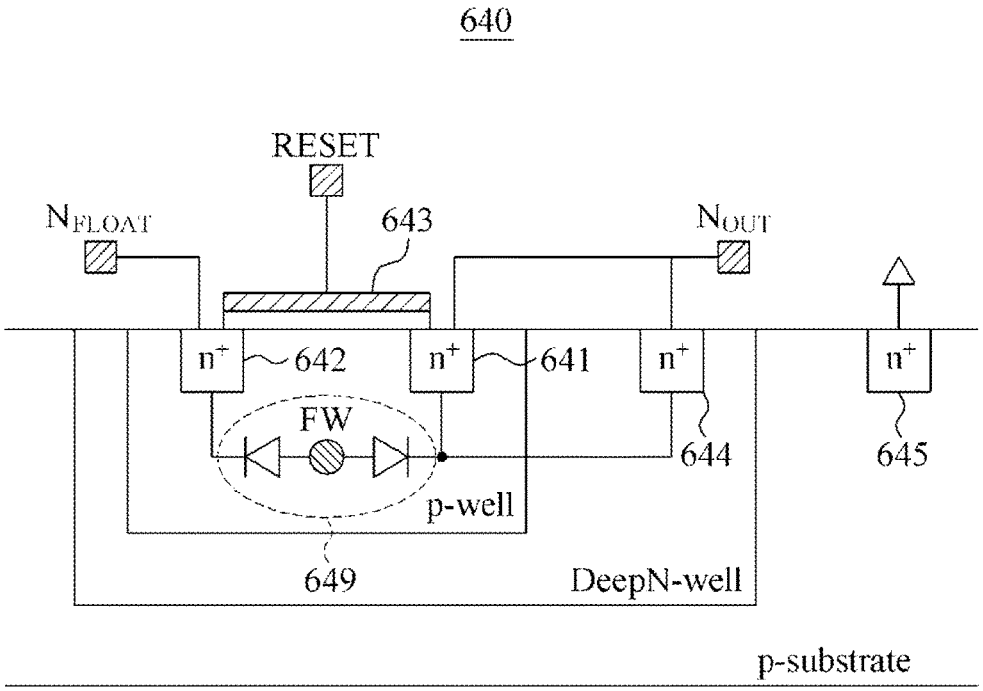
Figure 8A:
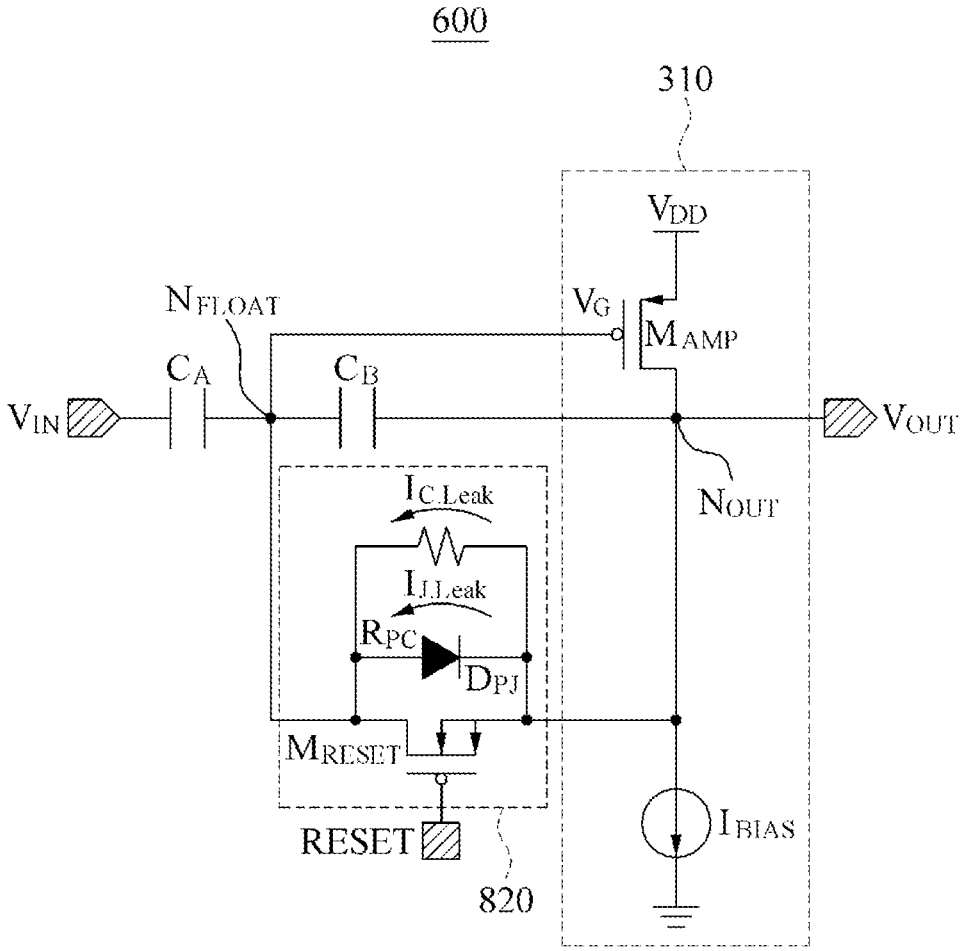
Figure 8B:
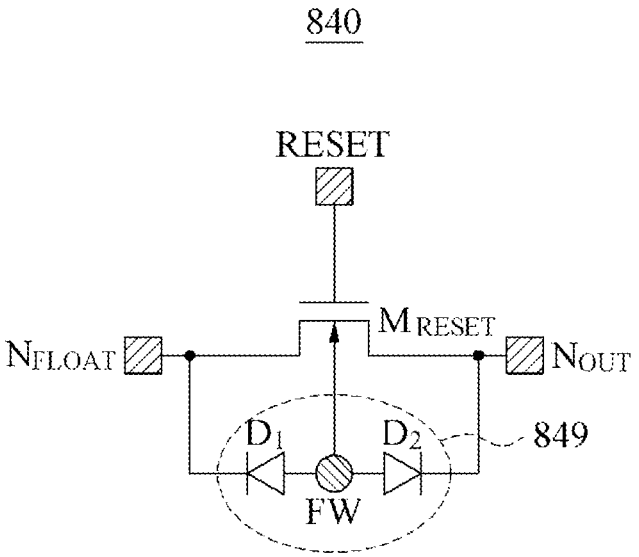

FIGS. 6A, 7A and 8A illustrate examples in which a body node of a transistor $M_{RESET}$ in a switch is connected to an output node $N_{OUT}$. FIGS. 6B, 7B and 8B illustrate examples in which the body node of the transistor $M_{RESET}$ is connected to a floating well FW.

To prevent the above-described error event, undesired device noise may need to be suppressed using a band-pass filter (BPF) while controlling a junction leakage current $I_{J.Leak}$ at a sensing element level. The difference amplifier 600 of FIGS. 6A through 8B may control the junction leakage current $I_{J.Leak}$ and may reduce device noise, by preventing an increase in a power consumption and an area of a sensing element.

FIG. 6A illustrates an example of a circuit of the difference amplifier 200 of FIG. 2. The amplifier 210 and the switch 220 of FIG. 2 may respectively correspond to an amplifier 310 and a switch 620 included in the difference amplifier 600 of FIG. 6A. The amplifier 310 of FIG. 3A and the amplifier 310 of FIG. 6A may have similar configurations.

The switch 620 may include a transistor $M_{RESET}$ configured to reset the amplifier 310 in response to a reset signal RESET. A body node of the transistor $M_{RESET}$ may be connected to an output stage of the amplifier 310. When the transistor $M_{RESET}$ is a PMOS transistor, a drain node may be connected to an input stage of the amplifier 310, a gate node may receive the reset signal RESET, and a source node may be connected to the output stage.

FIG. 6B illustrates a switch 640. The switch 640 may have a different configuration from the switch 620 of FIG. 6A, and may be used as the switch 220 of FIG. 2.

A transistor $M_{RESET}$ included in the switch 640 may be, for example, an NMOS transistor including a gate node configured to receive a reset signal RESET, a drain node connected to a floating node $N_{FLOAT}$, a source node connected to an output node $N_{OUT}$, and a body node connected to a floating well FW.

FIG. 7A illustrates a structure in which a body node 624 of the transistor $M_{RESET}$ included in the switch 620 is connected to an output node $N_{OUT}$ corresponding to the output stage of the amplifier 310.

In FIG. 7A, the transistor $M_{RESET}$ in the switch 620 may be, for example, a PMOS transistor. The body node 624 may be an n-well formed on a p-substrate, a gate node 623 may be a metal oxide film, and a source node 621 and a drain node 622 may be p+ regions. In addition, a portion 625 of the p-substrate may be connected to the ground.

The source node 621 and the body node 624 may be connected to the output stage of the amplifier 310. For example, the switch 620 may form a current path between the source node 621 and the drain node 622 by a connection between the output node $N_{OUT}$ of the difference amplifier 600 and a node (for example, the body node 624) in one side of the transistor $M_{RESET}$. In this example, the drain node 622 may be connected to a floating node $N_{FLOAT}$, and the source node 621 may be connected to the output node $N_{OUT}$. In other words, the current path may be formed between the floating node $N_{FLOAT}$ and the output node $N_{OUT}$ in the difference amplifier 600. The transistor $M_{RESET}$ may form a current path between the body node 624 and the input stage of the amplifier 310, so that the input stage and the body node 624 may be connected to the floating node $N_{FLOAT}$ and the output node $N_{OUT}$, respectively.

For example, the above-described current path may be formed as a resistance component (e.g., resistor) provided by an n-well and a diode having a PN junction between the body node 624 connected to the output node $N_{OUT}$ and the drain node 622 connected to the floating node $N_{FLOAT}$. Since the body node 624 is connected to the output node $N_{OUT}$, the current path formed between the source node 621 and the drain node 622 may have a diode component and a resistance component. In other words, the current path may include a resistor and a diode connected between the floating node $N_{FLOAT}$ and the output node $N_{OUT}$ in the difference amplifier 600.

FIG. 7B illustrates a structure in which a body node 644 of the transistor $M_{RESET}$ included in the switch 640 of FIG. 6B is connected to a floating well FW.

In FIG. 7B, the transistor $M_{RESET}$ in the switch 640 may be, for example, an NMOS transistor. The body node 644 may be a deep n-well formed on a p-substrate, a gate node 643 may be a metal oxide film, and a source node 641 and a drain node 642 may be n+ regions. In addition, a portion 645 of the p-substrate may be connected to the ground.

The body node 644 may be connected to the floating well FW. For example, the switch 640 may form a current path 649 between the source node 641 and the drain node 642 by a connection between the body node 644 and the floating well FW. In this example, the drain node 642 may be connected to the floating node $N_{FLOAT}$ of the difference amplifier 600, and the source node 641 may be connected to the output node $N_{OUT}$ of the difference amplifier 600. In other words, the current path 649 may be formed between the floating node $N_{FLOAT}$ and the output node $N_{OUT}$ in the difference amplifier 600. The transistor $M_{RESET}$ may form a current path between the body node 644 and the input stage of the amplifier 310, so that the input stage and the body node 644 may be connected to the floating node $N_{FLOAT}$ and the output node $N_{OUT}$, respectively.

For example, the above-described current path 649 may be formed as a diode having a PN junction between the floating well FW and the body node 644 connected to the output node $N_{OUT}$, a diode having a junction between the drain node 642 and the floating well FW, and a diode having a junction between the source node 641 and the floating well FW. The current path 649 formed between the source node 641 and the drain node 642 may have a diode component and a resistance component. In other words, the current path 649 may include a resistor and a diode connected between the floating node $N_{FLOAT}$ and the output node $N_{OUT}$ in the difference amplifier 600.

In FIG. 7B, diode components included in the current path 649 due to a connection between the floating well FW and the body node 644 may be symmetrically formed. For example, when the transistor $M_{RESET}$ of FIG. 7B is an NMOS transistor, the current path 649 may include a first diode component and a second diode component. The first diode component may operate in a direction from the floating well FW to the source node 641 as a forward direction, and the second diode component may operate in a direction from the floating well FW to the drain node 642 as a forward direction.

FIG. 8A illustrates an equivalent circuit of a current path formed between a source node and a drain node of a transistor $M_{RESET}$ included in a switch 820. The switch 820 may correspond to the switch 620 of FIGS. 6A and 7A.

Referring to FIG. 8A, the switch 820 may include a diode $D_{PJ}$ and a resistance component $R_{PC}$ that are connected between the source node and the drain node of the transistor $M_{RESET}$, in addition to the transistor $M_{RESET}$. The diode $D_{PJ}$ and the resistance component $R_{PC}$ may be an equivalent representation of a secondary effect obtained by connecting an output terminal $V_{OUT}$ of the difference amplifier 600 to a body node of the transistor $M_{RESET}$. The resistance component $R_{PC}$ may have, for example, a value of a few giga-ohms (GΩ) to a few tera-ohms (TΩ).

A path through which the junction leakage current $I_{J.Leak}$ flows from the body node to which the supply voltage $V_{DD}$ is applied toward the floating node $N_{FLOAT}$ in the switch 320 of FIG. 3A may be removed as shown in FIG. 8A. Since the path does not exist, a DC offset of the difference amplifier 600 may not occur. The difference amplifier 600 may not output an amplified DC offset and accordingly, an event-based vision sensor may not output a systematic false event. A result obtained by cutting off the junction leakage current $I_{J.Leak}$ will be further described with reference to FIG. 9 below.

In addition, a channel leakage current $I_{C.Leak}$ of the transistor $M_{RESET}$ may increase due to the resistance component $R_{PC}$. Due to an increase in the channel leakage current $I_{C.Leak}$, device noise of the difference amplifier 600 may be reduced. For example, in response to a body voltage and a source voltage becoming similar to each other, and in response to the channel leakage current $I_{C.Leak}$ increasing, the resistance component $R_{PC}$ may be generated, and accordingly, the circuit may show a characteristic of a BPF. Additionally, the junction leakage current $I_{J.Leak}$ may flow in a reverse direction to the diode $D_{PJ}$, and accordingly, the diode $D_{PJ}$ may function as a resistor and the circuit may show a characteristic of a BPF.

FIG. 8B illustrates an equivalent circuit of a current path 849 formed between a source node and a drain node of a transistor $M_{RESET}$ included in a switch 840. The switch 840 may correspond to the switch 640 of FIGS. 6B and 7B.

When the transistor $M_{RESET}$ of FIG. 8B is an NMOS transistor, the current path 849 formed in the switch 840 may be represented as including a first diode $D_1$ and a second diode $D_2$. The first diode $D_1$ may operate in a direction from a floating well FW of the difference amplifier 600 to the drain node as a forward direction, and the second diode $D_2$ may operate in a direction from the floating well FW to the source node as a forward direction. The first diode $D_1$ and the second diode $D_2$ may be an equivalent representation of a secondary effect obtained by connecting the floating well FW to a body node of the transistor $M_{RESET}$.

For example, the switch 840 may include the first diode $D_1$ and the second diode $D_2$, in addition to the transistor $M_{RESET}$. The first diode $D_1$ may be connected to the floating well FW and the drain node, and the second diode $D_2$ may be connected to the floating well FW and the source node. The first diode $D_1$ and the second diode $D_2$ may be connected in series and in opposite directions to each other.

Similarly to the description of FIG. 8A, in FIG. 8B, a path through which a junction leakage current $I_{J.Leak}$ flowing from a supply voltage $V_{DD}$ may be removed, and accordingly, a DC offset of the difference amplifier 600 may not occur. Since the difference amplifier 600 does not output an amplified DC offset, an event-based vision sensor may not output a systematic false event.

Since the first diode $D_1$ and the second diode $D_2$ are formed in opposite directions to each other, a reverse bias may be applied at all times, and the first diode $D_1$ and the second diode $D_2$ may function as resistors. Since the first diode $D_1$ and the second diode $D_2$ may function as resistors, the circuit may show a characteristic of a BPF.

The structures of the difference amplifier 600 of FIGS. 6A through 8B may show a characteristic of a BPF, and device noise in a low band may be reduced due to the characteristic of the BPF. Accordingly, the event-based vision sensor may not output a random false event. Reducing of device noise will be further described with reference to FIG. 13 below.

Figure 9:
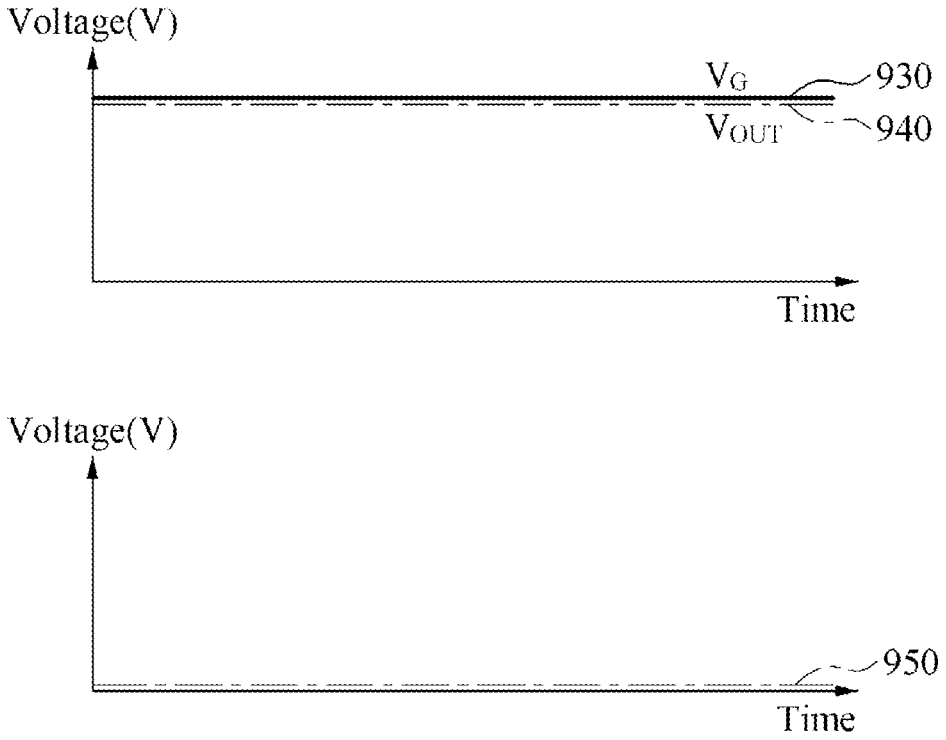
FIG. 9 illustrates a process of outputting an event signal in an event-based vision sensor including the difference amplifier of FIGS. 6A through 8B.

FIG. 9 illustrates a process of outputting an event signal in an event-based vision sensor including the difference amplifier 600 of FIGS. 6A through 8B.

An input voltage $V_{IN}$ input to the difference amplifier 600 may be equal to the input voltage $V_{IN}$ of FIG. 5. However, in FIGS. 6A through 8B, the junction leakage current $I_{J.Leak}$ may be removed. A DC offset may not occur due to a removal of the junction leakage current $I_{J.Leak}$, and accordingly, a gate voltage $V_G$ 930 and an output voltage $V_{OUT}$ 940 may remain unchanged. As described above, when the input voltage $V_{IN}$ remains unchanged, the gate voltage $V_G$ 930 and the output voltage $V_{OUT}$ 940 may also remain unchanged, and accordingly, an error event may not occur. When the input voltage $V_{IN}$ remains unchanged even though a waiting time continues, an event signal 950 may not be output.

Figure 10:
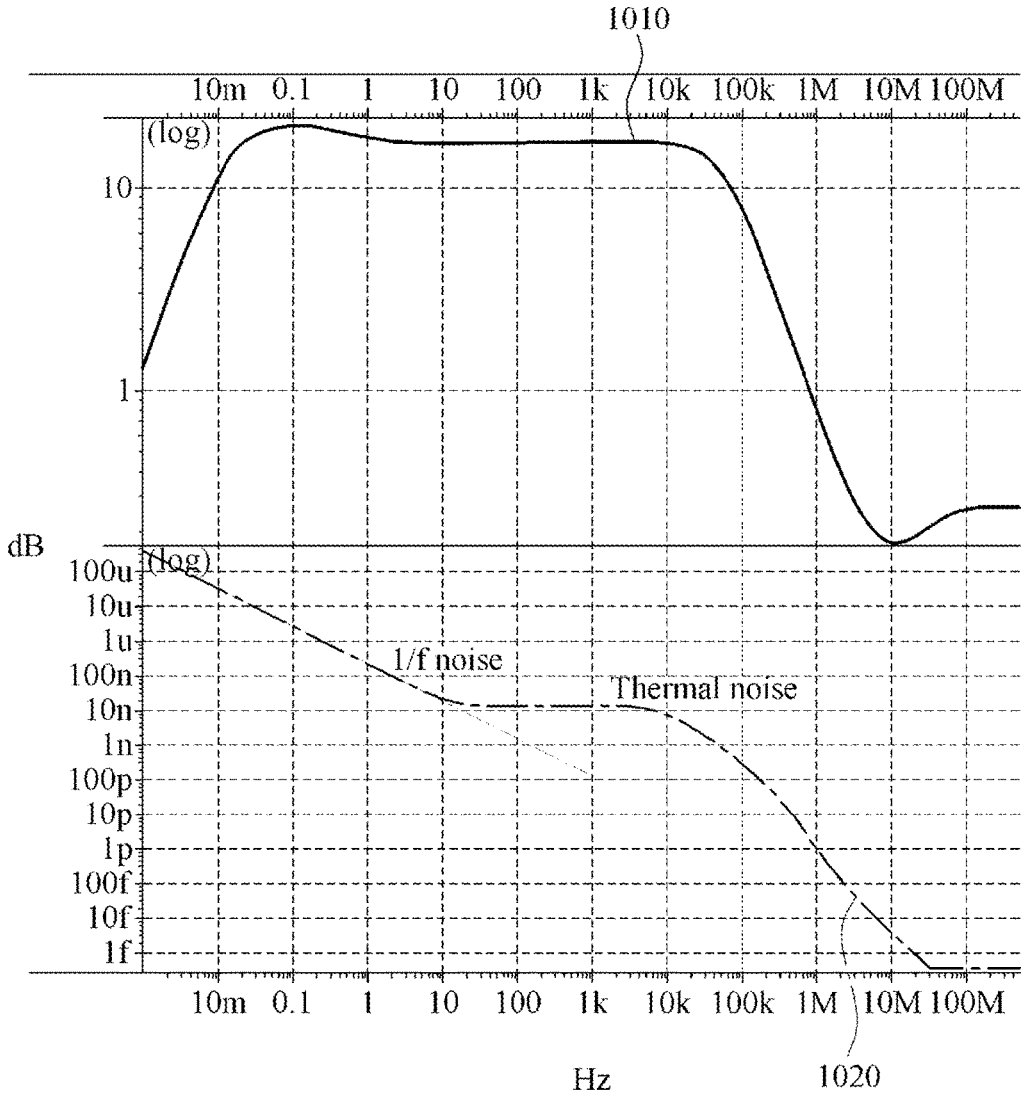
FIG. 10 is a graph illustrating output noise and a signal transfer function of the difference amplifier of FIGS. 3A and 4.

FIG. 10 is a graph illustrating output noise 1020 and a signal transfer function 1010 of the difference amplifier 300 of FIGS. 3A and 4.

The signal transfer function 1010 may be represented by, for example, an output voltage $V_{OUT}$/input voltage $V_{IN}$. The signal transfer function 1010 may be represented in a log scale. Based on a circuit structure of the difference amplifier 600, the difference amplifier 600 may show a characteristic of a BPF. The signal transfer function 1010 may have a gain of a frequency band of about 10 megahertz (MHz) to 100 kilohertz (KHz), and signals in the other frequency bands may be rejected.

In an output of the difference amplifier 600, 1/f noise may be dominant in a frequency band of about 0 hertz (Hz) to 10 Hz, and thermal noise may be dominant in a frequency band of about 10 Hz to 10 MHz, as shown in the output noise 1020. In the output noise 1020, the 1/f noise may have a great influence on the output voltage $V_{OUT}$ in comparison to the influence that the thermal noise has on the output voltage $V_{OUT}$. The output noise 1020 in a frequency band in which the 1/f noise frequently occurs may need to be reduced.

Figure 11:
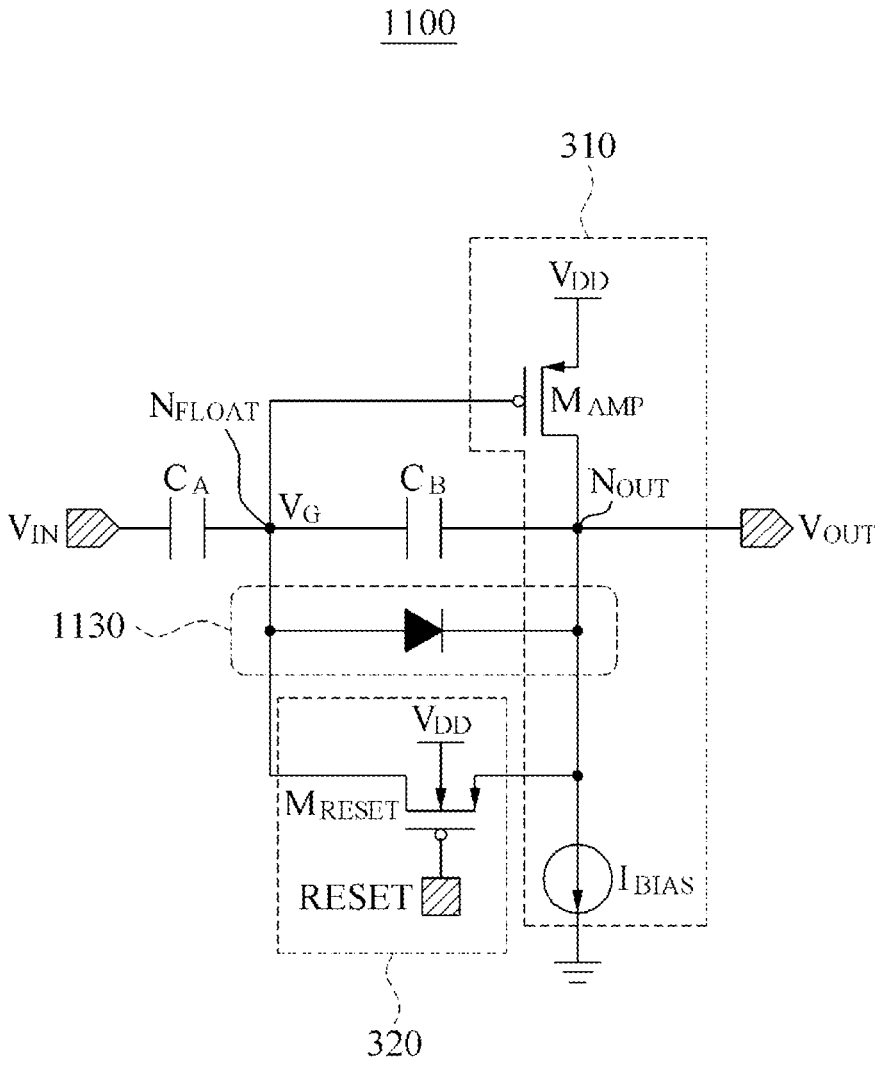
FIGS. 11 and 12 are diagrams illustrating examples of a configuration of a difference amplifier for reducing noise of a signal according to an exemplary embodiment.
Figure 12:
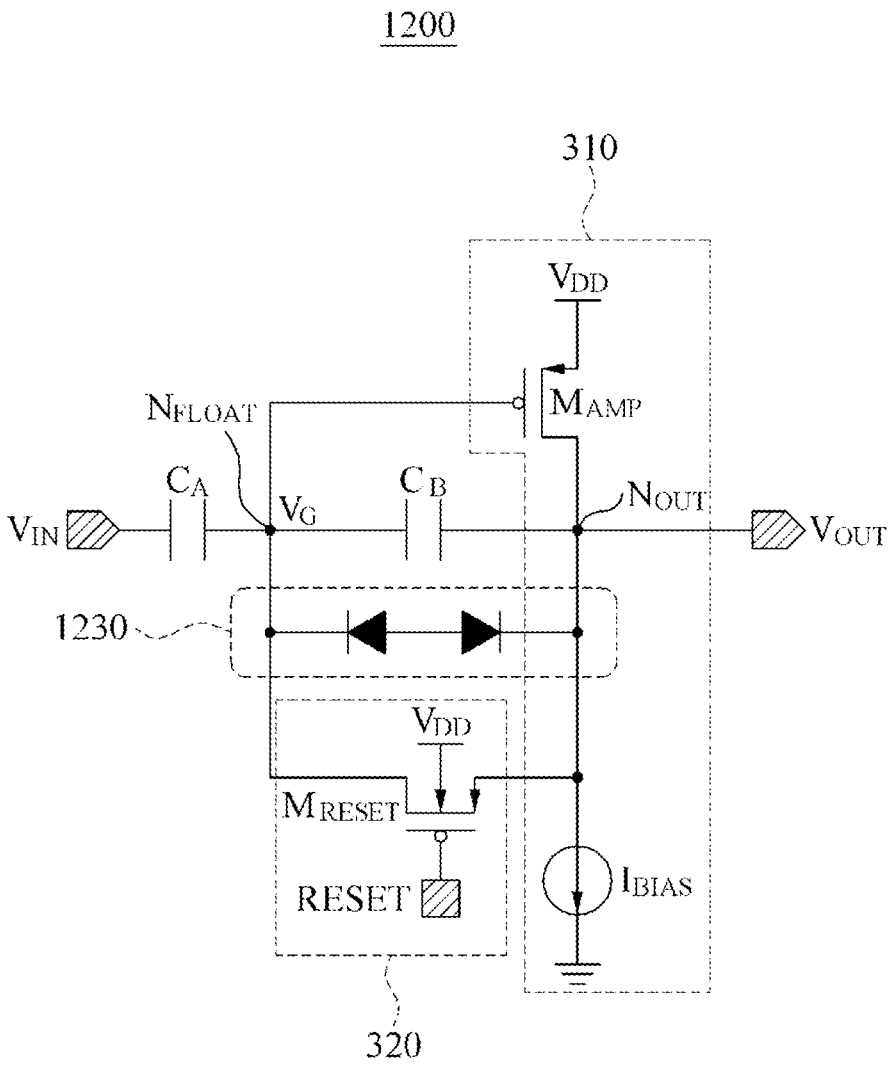

The above-described difference amplifier 600 of FIGS. 6A through 8B, a difference amplifier 1100 of FIG. 11 and a difference amplifier 1200 of FIG. 12 may reduce the output noise 1020 in a frequency band in which the 1/f noise frequently occurs.

FIGS. 11 and 12 illustrate configurations of the difference amplifiers 1100 and 1200 for reducing noise of a signal according to an exemplary embodiment.

Amplifiers 310 and switches 320 of FIGS. 11 and 12 may have similar configurations to the amplifier 310 and the switch 320 of FIG. 3A.

The difference amplifier 1100 may include a first diode in addition to the amplifier 310 and the switch 320. The first diode may form a current path 1130 between an input stage and an output stage of the amplifier 310 so that a leakage current generated by the amplifier 310 may flow through the current path 1130. The leakage current may be, for example, a channel leakage current $I_{C.Leak}$. The first diode may be connected between the input stage and the output stage of the amplifier 310.

When an inverse voltage is applied to the first diode, the first diode may function as a resistor. For example, when an output voltage $V_{OUT}$ is higher than a gate voltage $V_G$, the first diode may function as a resistor. Since the first diode functions as a resistor, the channel leakage current $I_{C.Leak}$ may flow from an output node $N_{OUT}$ to a floating node $N_{FLOAT}$.

The difference amplifier 1200 of FIG. 12 may include a second diode in addition to the amplifier 310, the switch 320, and the first diode of FIG. 11. The second diode may be located along a current path 1230 and may have an opposite polarity to a polarity of the first diode.

An inverse voltage may be applied to at least one of the first diode and the second diode in a circuit of FIG. 12, and accordingly, the current path 1230 may function as a resistor. Since the current path 1230 functions as a resistor at all times, the channel leakage current $I_{C.Leak}$ may flow from an output node $N_{OUT}$ to a floating node $N_{FLOAT}$.

A power source may supply a bias power to the amplifier 310, the switch 320, the first diode and the second diode. The power source may include a bias current source $I_{BIAS}$.

The difference amplifiers 1100 and 1200 may show a characteristic of a BPF. Each of the first diode and the second diode may be implemented by an n-well and a p+ region formed on a p-substrate. When an area of the p+ region in the n-well increases, a lower cutoff frequency with the characteristic of the BPF may increase.

A structure and a configuration of each of the difference amplifiers 600, 1100 and 1200 may be designed based on a type and combination of transistors used in an amplifier, a switch, or a combination thereof. The transistors may include, for example, a PMOS transistor and an NMOS transistor.

Figure 13:
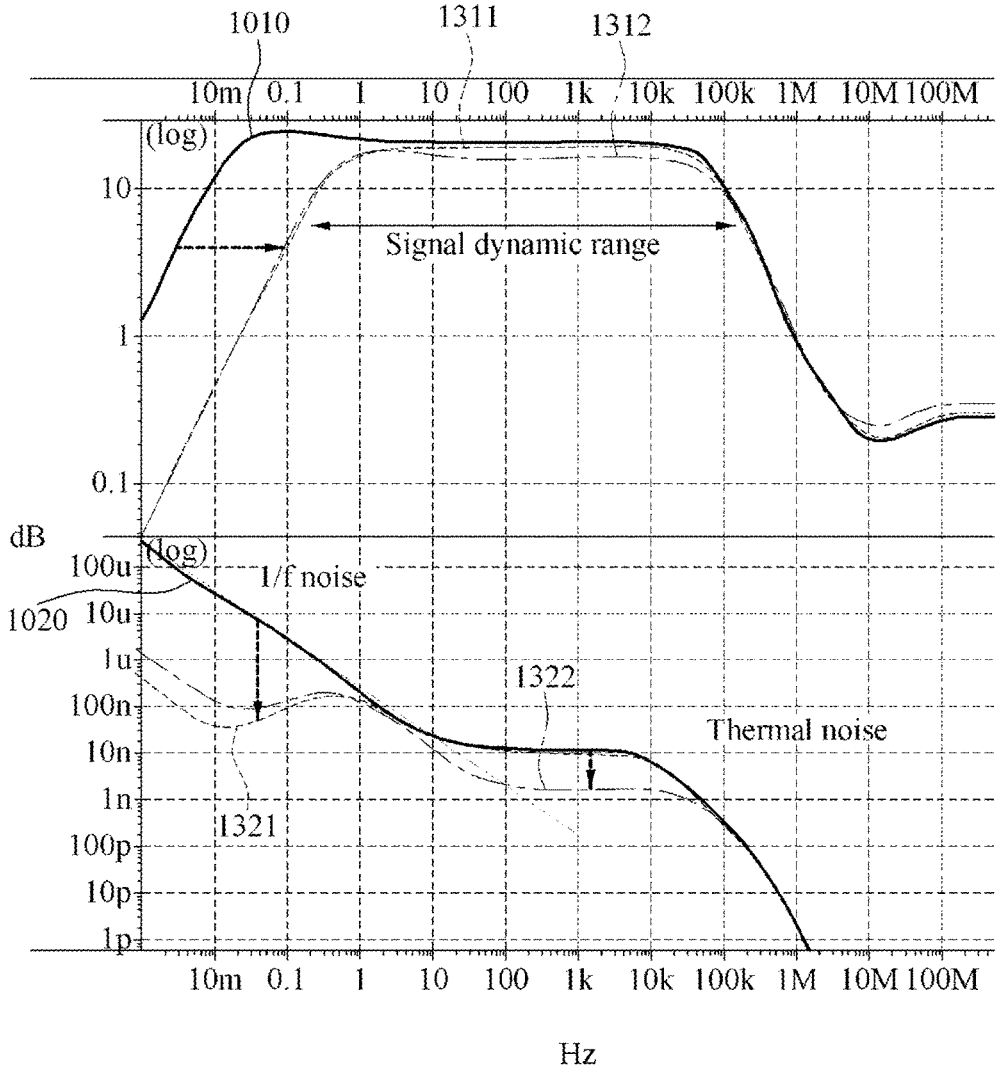
FIG. 13 is a graph illustrating output noise and a signal transfer function of each of the difference amplifiers of FIGS. 6A through 11.

FIG. 13 illustrates output noise 1321 and a signal transfer function 1311 of the difference amplifier 600 of FIGS. 6A through 8B and output noise 1322 and a signal transfer function 1312 of the difference amplifier 1100 of FIG. 11.

A sensing element included in an event-based vision sensor may operate in a predetermined signal dynamic range (for example, a desirable range). The sensing element may allow a signal having a frequency in the predetermined signal dynamic range to pass through the sensing element, and may reject a signal having a frequency in the other frequency ranges. For example, referring to FIG. 13, a signal dynamic range may be set as a frequency range of about 0.3 Hz to 100 KHz.

In comparison to the signal transfer function 1010 of FIG. 10, the signal transfer functions 1311 and 1312 may have increased lower cutoff frequencies. Referring to FIG. 13, lower cutoff frequencies of the difference amplifiers 600 and 1100 may be increased as indicated by an arrow in comparison to the lower cutoff frequency of the difference amplifier 300 of FIG. 10.

Based on the signal transfer functions 1311 and 1312, the difference amplifiers 600 and 1100 may reject a signal corresponding to a low frequency band (for example, a frequency band lower than 1 Hz).

In the output noise 1020 of FIG. 10, relatively high 1/f noise may occur in a low frequency band. 1/f noise in the output noise 1321 and 1/f noise in the output noise 1322 may be reduced as indicated by an arrow in comparison to the output noise 1020. Also, thermal noise in the output noise 1322 may be reduced as indicated by an arrow.

The difference amplifiers 600, 1100 and 1200 have been described above on the assumption that the difference amplifiers 600, 1100 and 1200 are applied to a sensing element in an event-based vision sensor, however, the exemplary embodiments are not limited thereto. For example, the difference amplifiers 600, 1100 and 1200 may be applicable to a circuit with a limited size and/or area (for example, a sensor including a sensing element or a pixel having a size equal to or less than 20 micrometers (μm)×20 μm), or a circuit that remains in a standby state for a long period of time (for example, a sensor, a buffer or an analog-to-digital converter (ADC)). The sensor may include, for example, a biometric sensor.

According to an exemplary embodiment, a voltage bias of a body node of a transistor included in a switch of a difference amplifier in a sensing element may be set as an output terminal. Accordingly, a systematic false event occurring due to a DC offset may be removed and device noise outside a desired signal range may be effectively reduced, by preventing an increase in a power consumption and an area of a circuit. Thus, it is possible to suppress an increase in power consumption due to an error event, and it is further possible to perform efficient processing in a digital circuit.

Also, it is possible to universally apply a circuit according to exemplary embodiments to a system (for example, various biomedical systems) in which an error signal is frequently generated due to a leakage current in a pixel as well as an event-based vision sensor.

Although a few exemplary embodiments have been shown and described, the present inventive concept is not limited thereto. Instead, it will be appreciated by those skilled in the art that changes may be made to these exemplary embodiments without departing from the principles and spirit of the exemplary embodiments, the scope of which is defined by the claims and their equivalents.

What is claimed is:

1. A [circuit configured to amplify a signal from which an offset is cancelled, the circuit] *difference amplifier* comprising:

an amplifier [comprising an input stage] configured to receive [an input] *a* signal[, the amplifier configured to] *through a floating node and* amplify the [input] signal, and *to* output the amplified signal *through an output node*; and

[a switch comprising] a *reset* transistor *connected between the floating node and the output node, and* configured to reset the amplifier in response to a reset signal,

*wherein* the *reset* transistor [comprising] *comprises:* a body node [connecting the transistor] *connected* to the [circuit] *output node*;

[wherein the transistor is configured to form a current path between the body node of the transistor and the input stage of the amplifier]

*a gate node configured to receive the reset signal;*

*a source node directly connected to the output node and the body node; and*

*a drain node directly connected to the floating node.*

[2. The circuit of claim 1, wherein:

the amplifier comprises an output stage configured to output the amplified signal, and the body node is connected to the output stage of the amplifier.]

[3. The circuit of claim 2, wherein:

the transistor further comprises a source node and a drain node; and the switch further comprises:

a diode connected between the source node and the drain node of the transistor, and a resistance component connected between the source node and the drain node of the transistor.]

[4. The circuit of claim 2, wherein the transistor is a p-channel metal-oxide-semiconductor (PMOS) transistor comprising a drain node connected to the input stage, a gate node configured to receive the reset signal, and a source node connected to the output stage.]

[5. The circuit of claim 1, wherein the amplifier comprises a PMOS transistor comprising a source node connected to a supply voltage, a gate node configured to receive the input signal, and a drain node configured to output an output signal corresponding to the amplified signal.]

[6. The circuit of claim 1, wherein the transistor comprises a floating well, and the body node is connected to the floating well of the transistor.]

[7. The circuit of claim 6, wherein:

the transistor further comprises a source node and a drain node;

the switch further comprises:

a first diode connected to the floating well and the source node of the transistor, and a second diode connected to the floating well and the drain node of the transistor, and wherein the first diode and the second diode are connected in series and in opposite directions to each other.]

[8. The circuit of claim 1, further comprising a power source configured to supply a bias power to the amplifier and the transistor.]

[9. The circuit of claim 1, wherein the amplifier comprises an output stage configured to output the amplified signal, and wherein the circuit further comprises:

a first capacitor connected to the input stage of the amplifier; and a second capacitor connected to the output stage of the amplifier.]

[10. A circuit configured to amplify a signal from which noise is reduced, the circuit comprising:

an amplifier configured to amplify an input signal, the amplifier comprising an input stage configured to receive the input signal and an output stage configured to output the amplified signal;

a switch comprising a transistor configured to reset the amplifier in response to a reset signal; and a first diode configured to form a current path between the input stage and the output stage of the amplifier so that a leakage current generated by the amplifier flows through the current path.]

[11. The circuit of claim 10, wherein the first diode is connected between the input stage and the output stage of the amplifier.]

[12. The circuit of claim 10, further comprising a second diode located along the current path and having an opposite polarity to the first diode.]

[13. The circuit of claim 10, wherein the transistor is a p-channel metal-oxide-semiconductor (PMOS) transistor comprising a drain node connected to the input stage, a gate node configured to receive the reset signal, a source node connected to the output stage, and a body node connected to a supply voltage.]

[14. The circuit of claim 10, wherein the amplifier comprises a PMOS transistor comprising a source node connected to a supply voltage, a gate node configured to receive the input signal, and a drain node configured to output an output signal corresponding to the amplified signal.]

[15. The circuit of claim 10, further comprising:

a power source configured to supply a bias power to the amplifier, the switch and the first diode.]

[16. An event-based vision sensor comprising:

a sensing element configured to sense an event, wherein the sensing element comprises:

an event detector configured to detect an occurrence of the event and generate an input signal based on the detected occurrence;

a difference amplifier configured to amplify the input signal; and an event signal generator configured to generate an event signal corresponding to the amplified signal by processing the amplified signal, wherein the difference amplifier comprises:

an input terminal configured to receive the input signal and an output terminal configured to output the amplified signal, and a switch configured to reset the difference amplifier in response to a reset signal, the switch comprising a node connecting the switch to the sensing element, and wherein the switch is configured to form a current path between the input terminal and the output terminal of the difference amplifier by a connection between the output terminal and the node.]

[17. The event-based vision sensor of claim 16, wherein the event detector comprises:

a photodiode configured to output a current corresponding to a change in an intensity of light received by the photodiode, in response to receiving the light; and a converter configured to convert the current to the input signal in the form of a voltage.]

[18. The event-based vision sensor of claim 16, wherein the event signal generator is configured to generate the event signal based on a result of a comparison between the amplified signal and a predetermined threshold.]

[19. The event-based vision sensor of claim 16, wherein the current path comprises:

a diode connected between the input terminal and the output terminal; and a resistance component connected between the input terminal and the output terminal.]

*20. The difference amplifier of claim 1, wherein the reset transistor is a P-channel metal-oxide-semiconductor (PMOS) transistor formed on a p-substrate,*

*the body node of the reset transistor is an n-well formed on the p-substrate,*

*the source node of the reset transistor is a first p+ region formed in the body node, and*

*the drain node of the reset transistor is a second p+ region formed in the body node.*

*21. The difference amplifier of claim 20, wherein a current path between the floating node and the output node is generated by connecting the body node to the output node.*

*22. The difference amplifier of claim 20, wherein the p-substrate is connected to a ground node.*

*23. The difference amplifier of claim 1, wherein the reset transistor is an N-channel metal-oxide-semiconductor (NMOS) transistor formed on a p-substrate,*

*the body node of the reset transistor is a deep n-well formed on the p-substrate and connected to a floating well,*

*the source node of the reset transistor is a first n+ region formed in the floating well, and*

*the drain node of the reset transistor is a second n+ region formed in the floating well.*

*24. The difference amplifier of claim 23, wherein a portion of the p-substrate is connected to a supply voltage.*

*25. The difference amplifier of claim 23, wherein a first diode is formed by the floating well and the source node, and a second diode is formed by the floating well and the drain node,*

*wherein the first diode is configured to operate in a direction from the floating well to the source node as a forward direction, and the second diode is configured to operate in a direction from the floating well to the drain node as a forward direction.*

*26. The difference amplifier of claim 1, wherein the amplifier comprising:*

*a first transistor connected between a supply voltage and the output node, and configured to operate in response to a voltage of the floating node; and*

*a bias current source connected between the output node and a ground node.*

*27. The difference amplifier of claim 1, further comprising:*

*a first capacitor connected between the floating node and an input stage; and*

*a second capacitor connected between the floating node and the output node.*

*28. A difference amplifier comprising:*

*a first capacitor connected between an input stage and a floating node;*

*an amplifier configured to receive a signal through a floating node and amplify the signal to output the amplified signal through an output node;*

*a second capacitor connected between the floating node and the output node; and*

*a reset transistor being a P-channel metal-oxide-semiconductor (PMOS) transistor, formed on a p-substrate, connected between the floating node and the output node, and configured to reset the amplifier in response to a reset signal,*

*wherein the reset transistor comprises:*

*a gate node configured to receive the reset signal;*

*a body node being a n-well formed on the p-substrate, and connected to the output node;*

*a source node being a first p+ region formed in the body node, and directly connected to the output node; and*

*a drain node being a second p+ region formed in the body node and directly connected to the floating node,*

*wherein a reset transistor forms a current path between the floating node and the output node.*

*29. The difference amplifier of claim 28, wherein a portion of the p-substrate is connected to a ground node.*

*30. The difference amplifier of claim 28, wherein the current path comprises a diode formed between the floating node and the output node by connecting the body node with the output node.*

*31. The difference amplifier of claim 28, wherein the amplifier comprising:*

*a first transistor connected between a supply voltage and the output node, configured to operate in response to a voltage the floating node; and*

*a bias current source connected between the output node and a ground node.*

*32. A event-based vision sensor comprising:*

*an event detector configured to detect a change in an intensity of light and output an input signal based on the change in the intensity of the light;*

*a difference amplifier configured to receive the input signal through an input stage, amplify the received input signal, and output the amplified signal through an output stage; and*

*an event signal generator configured to receive the amplified signal, and output an event signal corresponding the amplified signal,*

*wherein the difference amplifier comprises:*

*an amplifier configured to receive a signal through a floating node and amplify the signal to output the amplified signal through an output node; and*

*a reset transistor connected between the floating node and the output node, and configured to reset the amplifier in response to a reset signal,*

*wherein the reset transistor comprises:*

*a body node connected to the output node;*

*a gate node configured to receive the reset signal;*

*a source node directly connected to the output node and the body node; and*

*a drain node directly connected to the floating node.*

*33. The event-based vision sensor of claim 32, wherein the reset transistor is a P-channel metal-oxide-semiconductor (PMOS) transistor formed on a p-substrate connecting to a ground node,*

*the body node of the reset transistor is an n-well formed on the p-substrate,*

*the source node of the reset transistor is a first p+ region formed in the body node, and*

*the drain node of the reset transistor is a second p+ region formed in the body node.*

*34. The event-based vision sensor of claim 32, wherein the event detector comprises:*

*a photodiode configured to output a current corresponding to the change in the intensity of the light and*

*a converter configured to convert the current to the input signal in a form of a voltage.*

*35. The event-based vision sensor of claim 32, wherein the event signal generator is configured to generate the event signal based on a result of a comparison between the amplified signal and a predetermined threshold.*

* * * * *